(12) United States Patent
Kim et al.

(10) Patent No.: US 7,448,921 B2
(45) Date of Patent: Nov. 11, 2008

(54) USER IDENTIFICATION CARD CONNECTING DEVICE FOR BROADCAST RECEPTION APPARATUS AND BROADCAST RECEPTION APPARATUS HAVING THE SAME

(75) Inventors: Sung Ki Kim, Seoul (KR); Joon Kang, Seoul (KR); Jin Hyun Cho, Seoul (KR); Jae Soo Sim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/839,642

(22) Filed: Aug. 16, 2007

(65) Prior Publication Data

US 2008/0081518 A1  Apr. 3, 2008

(30) Foreign Application Priority Data

Sep. 29, 2006  (KR) .................. 10-2006-0095746

(51) Int. Cl.
*H01R 13/428* (2006.01)
(52) U.S. Cl. .................. 439/744; 439/159; 439/485; 361/715
(58) Field of Classification Search ........... 439/744, 439/159, 485, 487, 630, 632, 635, 633, 634, 439/945, 946; 361/715
See application file for complete search history.

(56) References Cited

U.S. PATENT DOCUMENTS

| 6,942,506 | B2 * | 9/2005 | Kimura et al. ............... 439/159 |
| 6,992,889 | B1 * | 1/2006 | Kashiwagi et al. .......... 361/700 |
| 7,090,519 | B2 * | 8/2006 | Muramatsu et al. ......... 439/159 |
| 7,133,285 | B2 * | 11/2006 | Nishimura ................... 361/715 |
| 2007/0274046 | A1 * | 11/2007 | Choi et al. ................... 361/702 |

FOREIGN PATENT DOCUMENTS

KR  10-0635147 B1  10/2006

* cited by examiner

*Primary Examiner*—Michael C Zarroli
(74) *Attorney, Agent, or Firm*—Sughrue Mion, PLLC

(57) ABSTRACT

A user identification card connecting device for a broadcast reception apparatus and a broadcast reception apparatus having the same are provided. The user identification card connecting device includes a frame which is provided with an insertion part into which a user identification card is inserted, a heat radiation device which is movably mounted to the frame to contact the user identification card, and an elastic member which biases the heat radiation device toward the user identification card to enable the heat radiation device to be kept in contact with the user identification card. Accordingly, the user identification card can be easily mounted and demounted to/from the connecting device, and heat from the user identification card can be effectively dissipated.

20 Claims, 8 Drawing Sheets

USER IDENTIFICATION CARD CONNECTING DEVICE FOR BROADCAST RECEPTION APPARATUS AND BROADCAST RECEPTION APPARATUS HAVING THE SAME

CROSS-REFERENCE TO RELATED APPLICATION

This application claims the benefit of Korean Patent Application No. 2006-0095746, filed on Sep. 29, 2006 in the Korean Intellectual Property Office, the disclosure of which is incorporated herein by reference.

BACKGROUND OF THE INVENTION

1. Field of the Invention

Devices and methods consistent with the present invention relate to a user identification card connecting device for a broadcast reception apparatus and a broadcast reception apparatus having the same and, more particularly, to a user identification card connecting device which is equipped with a heat radiation device for radiating heat from a user identification card, and to a broadcast reception apparatus having such a user identification card connecting device.

2. Description of the Related Art

A related art digital cable broadcast system can selectively receive a broadcast signal of in-band (IB) and a broadcast signal of out-of-band (OOB). Typically, the broadcast signal of the out-of-band is for a pay-per-view broadcast program, which only an identified user can view. A broadcast reception apparatus capable of receiving the broadcast signal of the out-of-band adopts a user identification card which is equipped with a conditional access system (CAS) and a memory unit in which subscriber's information for user identification is stored.

The user identification card is commonly called a "cable card", or a "PCMCIA card" because the user identification card meets standard requirements of the PCMCIA (Personal Computer Memory Card International Association). The user identification card can be mounted or demounted to/from the broadcast reception apparatus such as a set-top box, a digital broadcast TV or the like. Thus, the broadcast reception apparatus is equipped with a connecting device for mounting the user identification card. A related art user identification card connecting device is disclosed in Korean Patent Laid-open Publication No. 2006-22852.

Because the user identification card is very thin and equipped with an integrated circuit or a memory therein, heat radiation is generated from the user identification card, which may cause deterioration of the performance of the broadcast reception apparatus. Therefore, a heat radiation device having a cooling fan is used in the conventional broadcast reception apparatus to cool down the user identification card.

However, the heat radiation device having the cooling fan is complicated in structure, so it is difficult to be mounted to the broadcast reception apparatus which is tending to become slimmer. Also, according to a structural feature of inserting the user identification card into a slot of the broadcast reception apparatus, the heat radiation device is disposed with a distance from the user identification card. So, a heat radiation effect is low.

SUMMARY OF THE INVENTION

Therefore, it is an aspect of the invention to provide a user identification card connecting device for a broadcast reception apparatus which can facilitate mounting/demounting of a user identification card, simplify a structure, and improve an effect of radiating heat from the user identification card.

It is another aspect of the invention to provide a broadcast reception apparatus having the above user identification card connecting device.

Additional aspects and/or advantages of the invention will be set forth in part in the description which follows and, in part, will be obvious from the description, or may be learned by practice of the invention.

In accordance with an aspect of the invention, there is provided a user identification card connecting device for a broadcast reception apparatus, comprising: a frame which is provided with an insertion part into which a user identification card is inserted; a heat radiation device which is movably mounted to the frame to contact the user identification card; and an elastic member which biases the heat radiation device toward the user identification card to enable the heat radiation device to be kept in contact with the user identification card.

The elastic member may bias the heat radiation device in a direction perpendicular to an insertion direction of the user identification card.

The frame may include a first side-supporting part and a second side-supporting part which are formed with slots for guiding the insertion of the user identification card, and a connecting part which connects ends of the first and second side-supporting parts and is provided with a terminal part to which the user identification card is electrically connected.

The heat radiation device may include a supporting plate which is movably mounted to the frame, a contact part which is formed at a lower surface of the supporting plate and located in a space between the first and second side-supporting parts to contact the user identification card, and a plurality of heat radiation fins which are formed at an upper surface of the supporting plate.

The heat radiation device may further include a plurality of coupling pins which penetrate the supporting plate and are fixed to the frame to movably couple the supporting plate to the frame, and the elastic member includes a plurality of coil springs which are coupled to the coupling pins to bias the supporting plate toward the user identification card.

The heat radiation device may be provided with an insertion guide surface which is slantedly formed at an end portion of the heat radiation device to guide the insertion of the user identification card.

The contact part of the heat radiation device may be formed with a protrusion at a lower surface. While the user identification card is being inserted, the contact part is separated from the user identification card, and when the user identification card is fully inserted, the user identification card is fixed.

The coupling pins may include a screw part which is tightened into the frame, a supporting part which has a larger diameter than the screw part and penetrates the supporting plate, and a head part which is formed at a top of the supporting part and has a larger diameter than the supporting part to support an end of the coil spring.

The frame may be formed with a plurality of supporting legs for spacing the first and second side-supporting parts apart from a body to which the frame is fixed.

The user identification card connecting device may further comprise binding springs which are provided in the slots of the first side-supporting part and the second side-supporting part to bind the user identification card when the user identification card is fully inserted.

In accordance with another aspect of the invention, there is provided a broadcast reception apparatus including a user identification card which is equipped with a conditional access system for selectively receiving a broadcast signal and a memory unit for storing subscriber's information for user identification, and a connecting device to which the user identification card is removably connected, characterized in that: the connecting device includes a frame which is provided with an insertion part into which a user identification card is inserted, a heat radiation device which is movably mounted to the frame to contact the user identification card, and an elastic member which biases the heat radiation device toward the user identification card to enable the heat radiation device to be kept in contact with the user identification card.

BRIEF DESCRIPTION OF THE DRAWINGS

These and/or other aspects and advantages of the exemplary embodiments of the invention will become apparent and more readily appreciated from the following description of the embodiments, taken in conjunction with the accompanying drawings, of which.

DETAILED DESCRIPTION OF EXEMPLARY EMBODIMENTS

Figure 1:
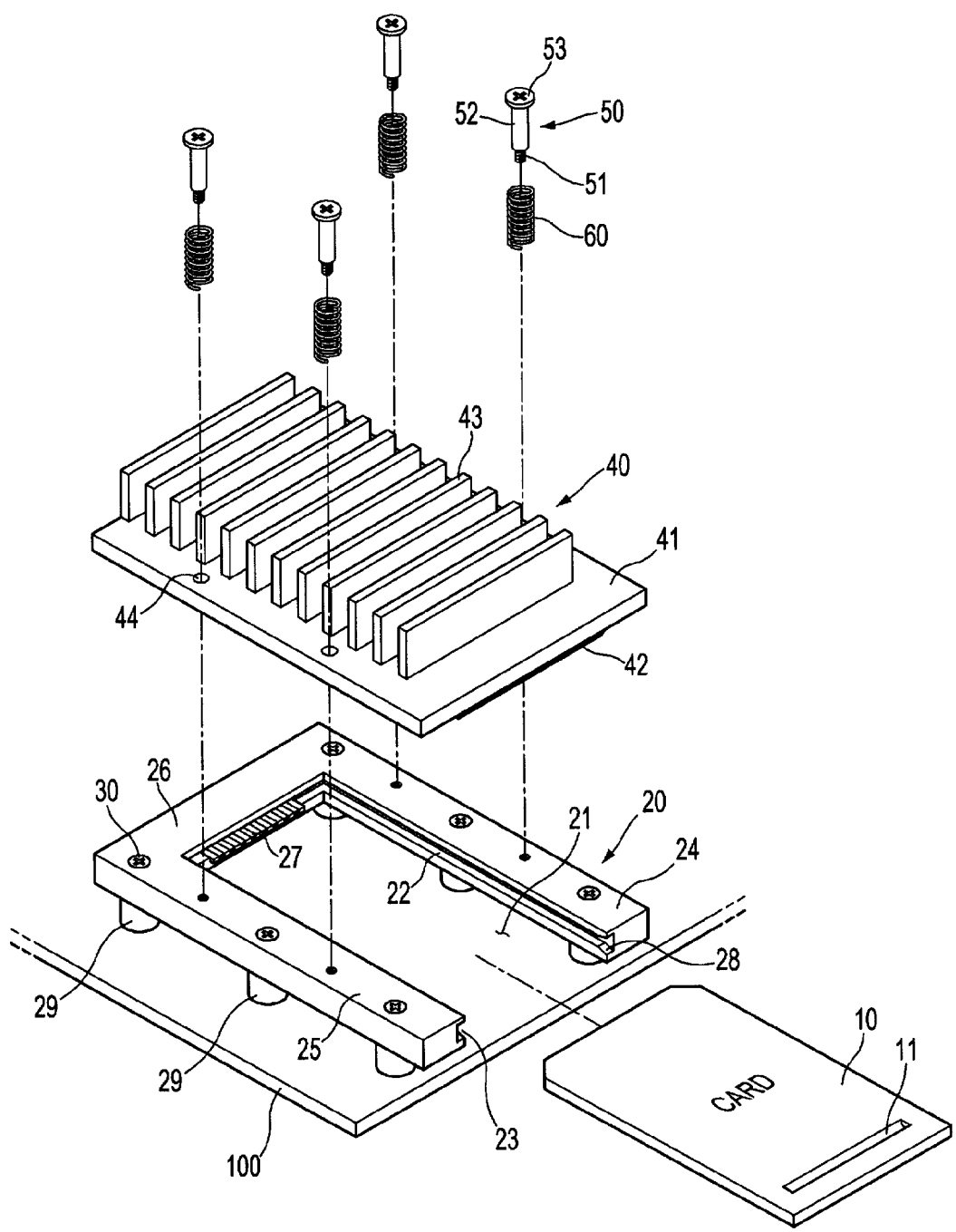
FIG. 1 is an exploded perspective view showing a user identification card connecting device for a broadcast reception apparatus in accordance with an exemplary embodiment of the present invention.

Reference will now be made in detail to exemplary embodiments of the present invention, examples of which are illustrated in the accompanying drawings, wherein like reference numerals refer to like elements throughout. The embodiments are described below to explain the present invention by referring to the figures.

As shown in FIG. 1, a user identification card connecting device for a broadcast reception apparatus according to an exemplary embodiment of the present invention comprises a frame 20 which is provided with an insertion part 21 into which a user identification card 10 is inserted, and a heat radiation device 40 which radiates heat from the user identification card 10. The user identification card 10 is equipped with a conditional access system (CAS) which enables only an identified user to view a TV program of a broadcast signal of out-of-band (OOB), and a memory unit in which subscriber's information for user identification is stored.

Figure 5:
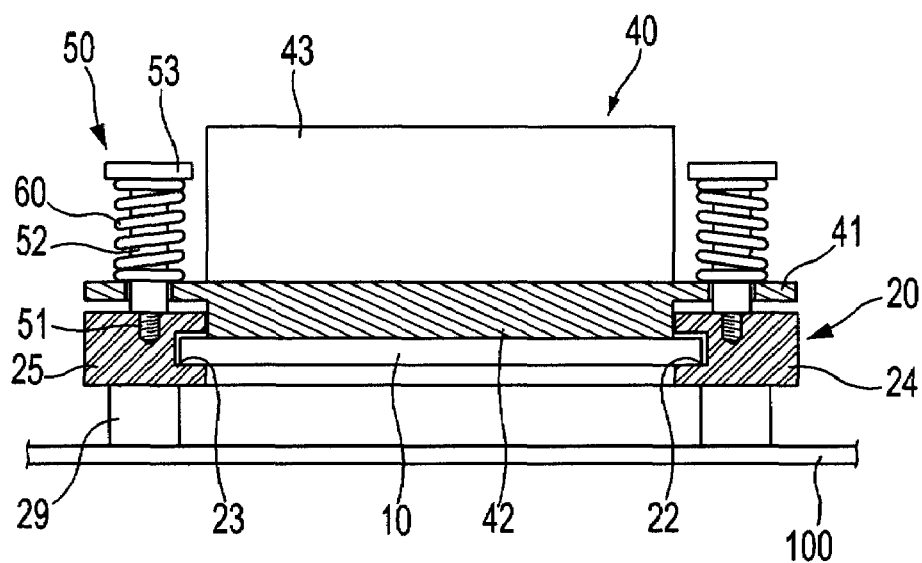
FIG. 5 is a sectional view taken along line V-V' in FIG. 4.

As shown in FIGS. 1 and 5, the frame 20 includes a first side-supporting part 24 and a second side-supporting part 25 which support both sides of the user identification card 10, and a connecting part 26 which connects the ends of the first and second side-supporting parts 24 and 25. The first side-supporting part 24 and the second side-supporting part 25 are formed with slots 22 and 23, respectively, for guiding the insertion of the user identification card 10. The connecting part 26 is provided with a terminal part 27 to which the user identification card 10 is electrically connected when the user identification card 10 is fully inserted into the frame 20. In order to facilitate the insertion of the user identification card 10, the first and second side-supporting parts 24 and 25 are formed with expanded entrance portions 28 at open ends of the slots 22 and 23.

A plurality of supporting legs 29 are coupled to lower surfaces of the first and second side-supporting parts 24 and 25 so that the frame 20 is spaced apart from an inner surface of a case 100 of the broadcast reception apparatus. The supporting legs 29 are fixed to the case 100 of the broadcast reception apparatus by use of fixing screws 30.

Such a mounting structure of the frame 20 allows air to freely flow all around the user identification card 10, so as to effectively dissipate heat from the user identification card 10.

The heat radiation device 40 includes a supporting plate 41 which covers an upper surface of the frame 20 and is movably mounted to the frame 20 by use of a plurality of coupling pins 50, and a contact part 42 which is formed at a lower surface of the supporting plate 41 and located in a space between the first and second side-supporting parts 24 and 25 to contact the user identification card 10. The heat radiation device 40 further includes a plurality of heat radiation fins 43 which are formed at an upper surface (outwardly) of the supporting plate 41.

The coupling pins 50 for coupling the heat radiation device 40 to the frame 20 include a screw part 51 which is tightened into the frame 20, a supporting part 52 which has a larger diameter than the screw part 51 and penetrates the supporting plate 41, and a head part 53 which is formed at a top of the supporting part 52 and has a larger diameter than the supporting part 52.

A diameter of the supporting part 52 is smaller than a diameter of a through-hole 44 formed at the supporting plate 41 of the heat radiation device 40. This is for allowing the heat radiation device 40 to move up and down with respect to the frame 20. The respective coupling pins 50 are provided with coil springs 60 for biasing the heat radiation device 40 toward the user identification card 10.

Figure 3:
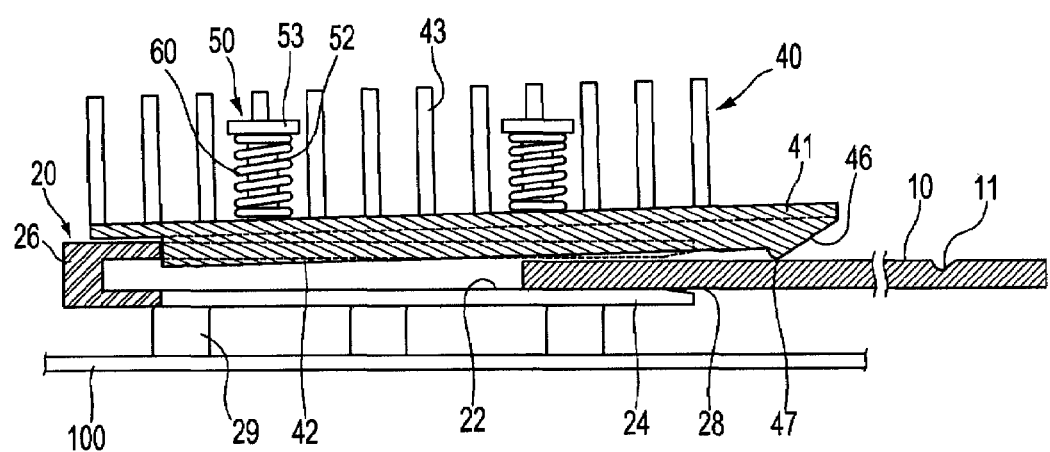
FIG. 3 is a sectional view showing a process of inserting a user identification card into a user identification card connecting device for a broadcast reception apparatus in accordance with an exemplary embodiment of the present invention.

As shown in FIG. 5, the coil spring 60 is fitted around the coupling pin 50, and supported by the coupling pin 50. One end of the coil spring 60 is supported by the head part 53 of the coupling pin 50, and the other end pressurizes the upper surface of the supporting plate 41 of the heat radiation device 40. In other words, the coil spring 60 pressurizes the heat radiation device 40 in a direction perpendicular to the insertion direction of the user identification card 10. Accordingly, when the user identification card 10 is inserted into the frame 20, as shown in FIG. 3, the heat radiation device 40 is lifted upward, and the user identification card 10 can be easily mounted. After being fully inserted into the frame 20, as shown in FIGS. 4 and 5, the coil springs 60 bias the heat radiation device 40 toward the user identification card 10 so that the contact part 42 of the heat radiation device 40 comes into close contact with the surface of the user identification card 10.

For movably coupling the heat radiation device 40 to the frame 20, the screw type coupling pins 50 are used in this embodiment, however, the coupling is not restricted thereto and other couplings may be used. For example, the heat radiation device 40 may be movably coupled to the frame 20 by coupling means such as supporting protrusions or hooks which extend upward from the frame 20 to support the border of the heat radiation device 40. Also, means for biasing the heat radiation device 40 toward the user identification card 10 is not limited to the coil springs 60. Among other things, elastic clips, plate springs, rubber or elastic resin, for example, may be used for biasing the heat radiation device 40 toward the user identification card 10.

Figure 2:
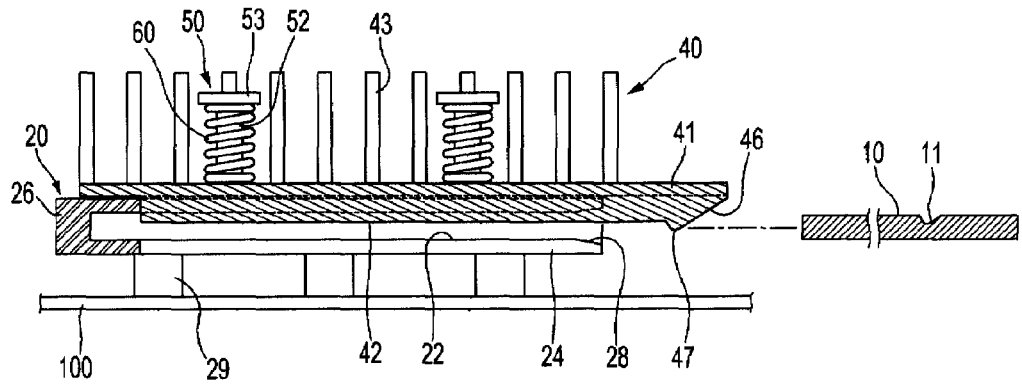
FIG. 2 is a sectional view showing a user identification card connecting device for a broadcast reception apparatus in accordance with an exemplary embodiment of the present invention, from which the user identification card is removed.

As shown in FIG. 2, an insertion guide surface 46 is slantedly formed at an end portion of the heat radiation device 40, through which the user identification card 10 is inserted, and a protrusion 47 is formed toward the user identification card 10 at a lower surface of the contact part 42 adjacent to the insertion guide surface 46. Accordingly, when inserting the user identification card 10 into the frame 20, the insertion guide surface 46 guides a front end of the user identification card 10 to be easily located in the insertion position, and the protrusion 47 separates the lower surface of the contact part 42 of the heat radiation device 40 from the user identification card 10, so as to minimize a friction between the contact part 42 of the heat radiation device 40 and the user identification card 10, thereby facilitating the insertion of the user identification card 10 (see FIG. 3).

Figure 4:
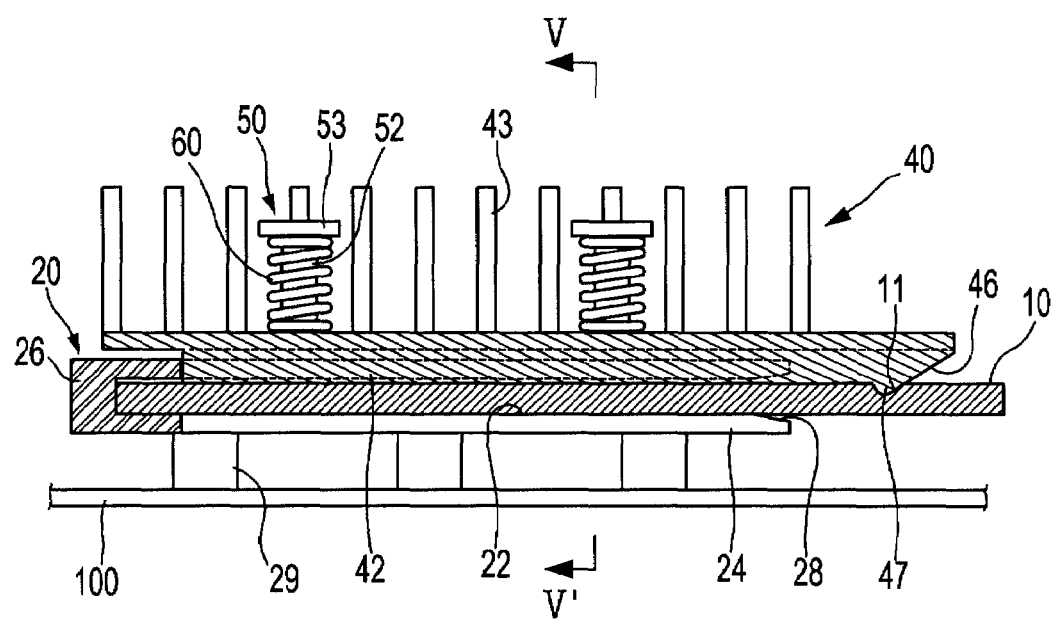
FIG. 4 is a sectional view showing a user identification card connecting device for a broadcast reception apparatus in accordance with an exemplary embodiment of the present invention, into which the user identification card is fully inserted.

As shown in FIG. 4, when the user identification card 10 is fully inserted into the frame 20, the protrusion 47 is fitted in a fixing recess 11 formed at the user identification card 10 to fix the user identification card 10. Therefore, so long as an external pulling force is not exerted on the user identification card 10, the user identification card 10 is not easily separated from the frame 20.

Hereinafter, an operation of mounting a user identification card to the connecting device of an exemplary embodiment of the present invention will be described.

As shown in FIG. 2, before inserting the user identification card 10 into the frame 20, the coil springs 60 pressurize the heat radiation device 40 down. A lower end of the contact part 42 of the heat radiation device 40 descends to the position of the slots 22 and 23.

As shown in FIG. 3, when initially inserting the user identification card 10 into the slots 22 and 23 of the frame 20, the front end of the user identification card 10 is guided to be easily inserted into the slots 22 and 23 by the insertion guide surface 46 of the heat radiation device 40. Especially, while inserting the user identification card 10, because the protrusion 47 of the heat radiation device 40 contacts the upper surface of the user identification card 10, the contact part 42 of the heat radiation device 40 is separated from the upper surface of the user identification card 10. So, the friction between the heat radiation device 40 and the user identification card 10 is minimized, and the user identification card 10 can be easily mounted.

As shown in FIG. 4, when the user identification card 10 is fully inserted into the frame 20, the protrusion 47 of the heat radiation device 40 is fitted in the fixing recess 11 of the user identification card 10. Accordingly, the contact part 42 of the heat radiation device 40 comes into close contact with the user identification card 10, and heat from the user identification card 10 is effectively dissipated. Further, since the user identification card 10 is fixed by the protrusion 47 being fitted in the fixing recess 11, the arbitrary separation of the user identification card 10 from the connecting device is prevented. That is, the protrusion prevents the identification card from being accidentally removed from the frame. On the other hand, when the user identification card 10 is intended to be separated from the connecting device, if the user identification card 10 is pulled outwardly, the heat radiation device 40 is lifted upward and the user identification card 10 can be easily separated.

Figure 6:
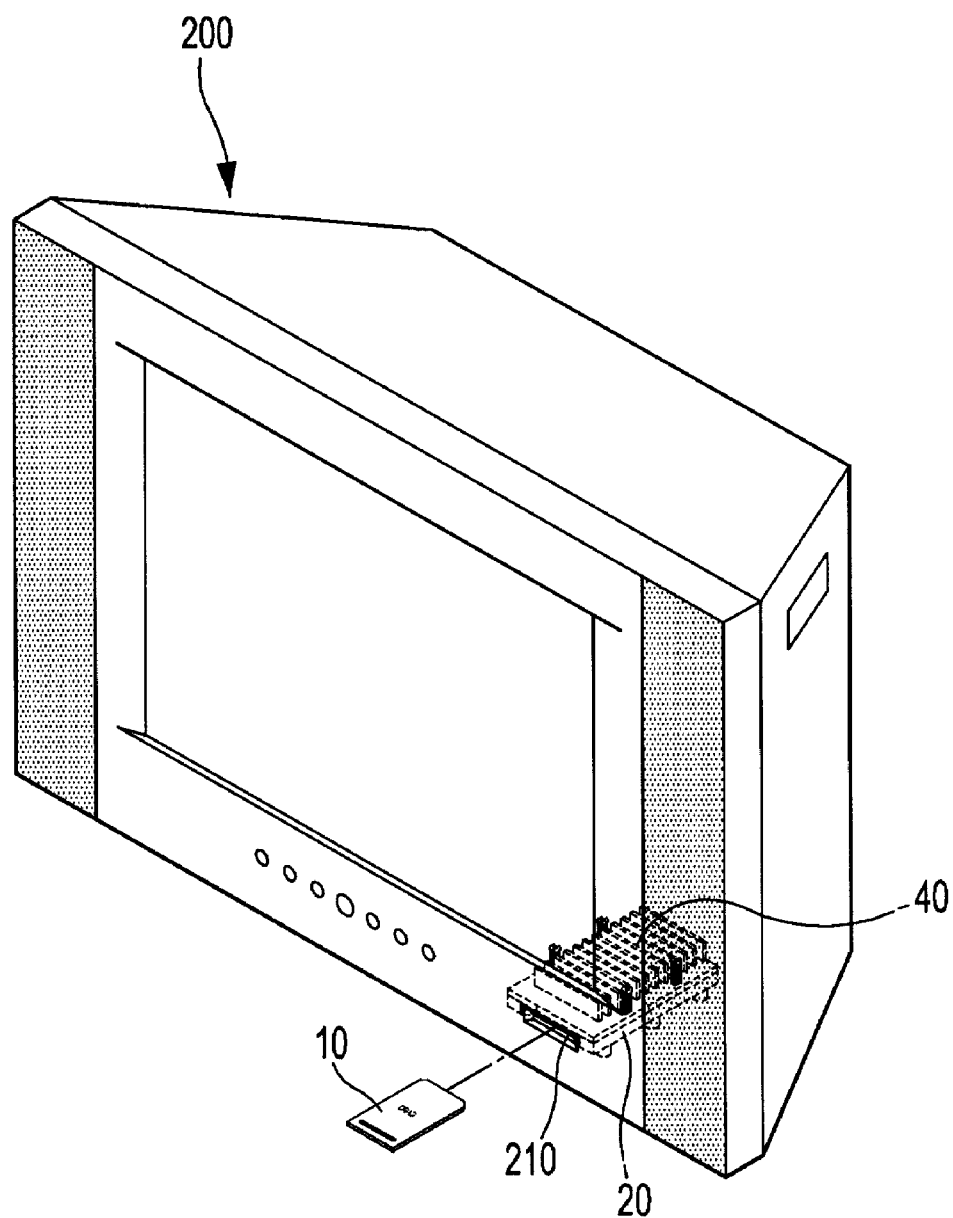
FIG. 6 is a perspective view showing a broadcast reception apparatus having a user identification card connecting device in accordance with an exemplary embodiment of the present invention.

FIG. 6 is a perspective view showing a TV capable of receiving a digital cable broadcast signal, which has the user identification card connecting device in accordance with the present invention. A TV 200 is formed with an opening 210 at its front surface, through which the user identification card 10 is inserted. The user identification card connecting device is mounted near the opening 210 inside the TV.

Although it is illustrated in FIG. 6 that the user identification card connecting device is applied to the TV 200, connecting devices according to exemplary embodiments of the present invention can be applied to all kinds of broadcast reception apparatuses having a function of receiving a digital cable broadcast signal, for example, an external broadcast reception apparatus like a set-top box or a computer having a broadcast reception function. Also, the user identification card connecting devices according to exemplary embodiments of the present invention may be applied to a wireless broadcast reception device.

Figure 7:
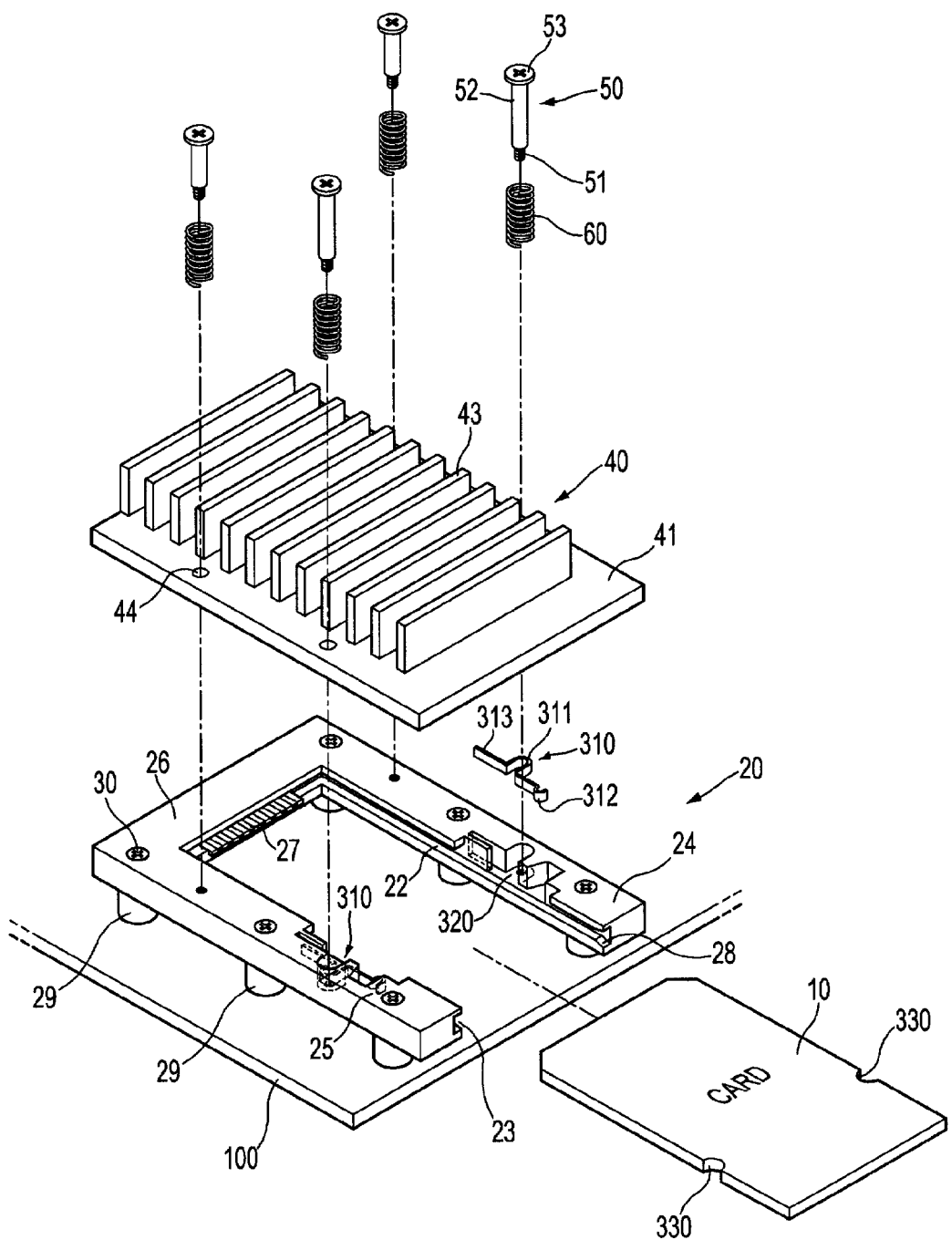
FIG. 7 is an exploded perspective view showing a user identification card connecting device for a broadcast reception apparatus in accordance with another exemplary embodiment of the present invention.
Figure 8:
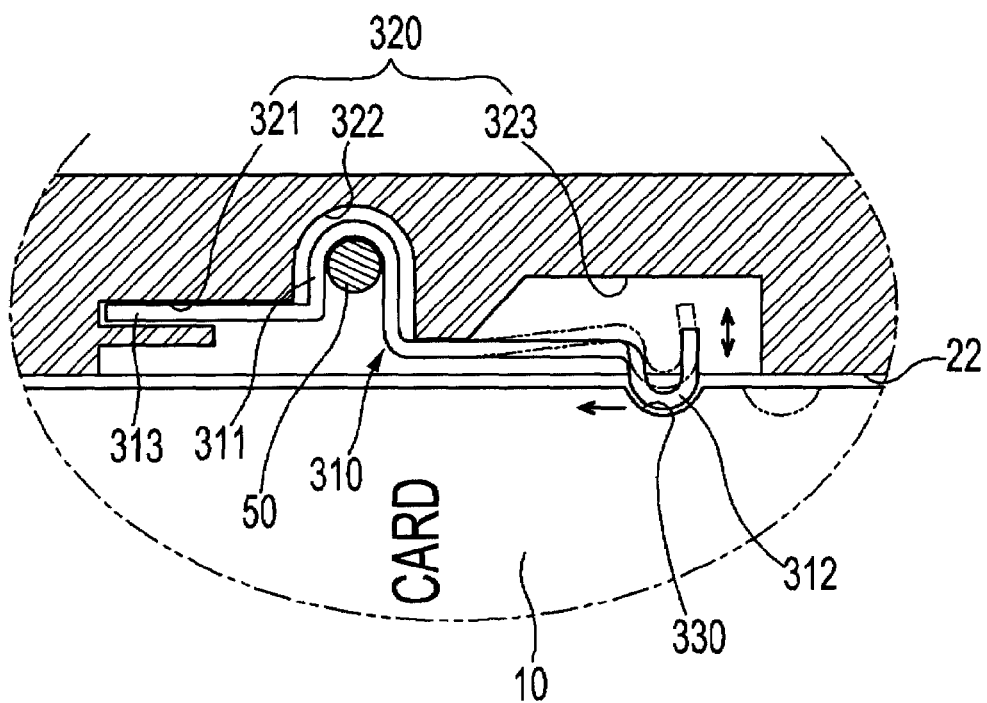
FIG. 8 is a sectional view illustrating a binding spring depicted in FIG. 7.

FIGS. 7 and 8 show a user identification card connecting device for a broadcast reception apparatus according to another exemplary embodiment of the present invention. As shown in FIGS. 7 and 8, a user identification card connecting device of this embodiment includes binding springs 310 which bind the user identification card 10 when inserting the user identification card 10 into the slots 22 and 23 of the first and second side-supporting parts 24 and 25. The user identification card 10 is provided with binding recesses 330 at both sides, into each of which a portion of each binding spring 310 is fitted, so that the user identification card 10 is caught by the binding springs 310.

The binding springs 310 have a plate spring shape having a predetermined elasticity. Each of the binding springs 310 has a fixing portion 311 which is fixed by the tightening of the coupling pin 50, and a latching portion 312 which is fitted into the binding recess 330 of the user identification card 10 by the elastic deformation. The first and second side-supporting parts 24 and 25 are formed with spring receiving recesses 320 to install the binding springs 310. As shown in FIG. 8, each of the spring receiving recesses 320 includes a first receiving recess portion 321 in which an end portion 313 of the binding spring 310, opposite to the latching portion 312, is fixedly received, a second receiving recess portion 322 in which the fixing portion 311 of the binding spring 310 is fixedly received, and a third receiving recess portion 323 in which the latching portion 312 of the binding spring 310 is elastically deformably received.

As shown in FIG. 8, when inserting the user identification card 10 into the slots 22 and 23, the latching portions 312 of the binding springs 310 mounted on the first and second side-supporting parts 24 and 25 are elastically deformed to permit the user identification card 10 to be inserted into the user identification card connecting device. If the user identification card 10 is fully inserted, the latching portions 312 of the binding springs 310 are elastically deformed to be fitted into the binding recesses 330 of the user identification card 10, thereby securely binding the user identification card 10. Accordingly, so long as external force is not applied, the user identification card 10 is not separated from the frame 20.

As apparent from the above description, according to the user identification card connecting device for a broadcast reception apparatus of the present invention, since the heat radiation device is provided such that it is movable in a direction perpendicular to the insertion direction of the user identification card, the user identification card can be easily mounted and demounted to/from the connecting device.

When the user identification card is fully mounted to the connecting device, since the heat radiation device closely contacts the user identification card by an elastic force of the elastic member, heat from the user identification card can be effectively dissipated.

Further, while mounting the user identification card, since the heat radiation device is separated from the user identification card by the protrusion of the heat radiation device, the friction between the heat radiation device and the user identification card is minimized, and the user identification card can be easily mounted.

Still further, when the user identification card is fully mounted to the connecting device, since the user identification card is fixed by the protrusion of the heat radiation device being fitted in the fixing recess of the user identification card, the arbitrary separation of the user identification card from the connecting device can be prevented.

Although embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A user identification card connecting device, comprising:
   a frame which is provided with an insertion part into which a user identification card is inserted;
   a heat radiation device which is movably mounted to the frame to contact the user identification card; and
   an elastic member which biases the heat radiation device toward the user identification card to enable the heat radiation device to be kept in contact which the user identification card;
   wherein the heat radiation device includes a contact part the contacts the user identification card, the contact part of the heat radiation device is formed with a protrusion at a lower surface,
   whereby while the user identification card is being inserted, the contact part is separated from the user identification card, and
   when the user identification card is fully inserted, the user identification card is fixed.

2. The user identification card connecting device according to claim 1, wherein the elastic member biases the heat radiation device in a direction perpendicular to an insertion direction of the user identification card.

3. The user identification card connecting device according to claim 2, wherein the frame includes a first side-supporting part and a second side-supporting part which are formed with slots for guiding the insertion of the user identification card, and a connecting part which connects ends of the first and second side-supporting parts and is provided with a terminal part to which the user identification card is electrically connected.

4. The user identification card connecting device according to claim 3, wherein the heat radiation device includes a supporting plate which is movably mounted to the frame, the contact part is formed at a lower surface of the supporting plate and located between the first and second side-supporting parts to contact the user identification card, and a plurality of heat radiation fins which are formed at an upper surface of the supporting plate.

5. The user identification card connecting device according to claim 4, wherein the heat radiation device further includes a plurality of coupling pins which penetrate the supporting plate and are fixed to the frame to movably couple the supporting plate to the frame, and
   the elastic member includes a plurality of coil springs which are coupled to the coupling pins to bias the supporting plate toward the user identification card.

6. The user identification card connecting device according to claim 4, wherein the heat radiation device is provided with an insertion guide surface comprising a slanted surface at an end portion of the heat radiation device to guide the insertion of the user identification card.

7. The user identification card connecting device according to claim 5, wherein the coupling pins include a screw part which is tightened into the frame, a supporting part which has a larger diameter than the screw part and penetrates the supporting plate, and a head part which is formed at a top of the supporting part and has a larger diameter than the supporting part to support an end of the coil spring.

8. The user identification card connecting device according to claim 3, wherein the frame is formed with a plurality of supporting legs for spacing the first and second side-supporting parts apart from a body to which the frame is fixed.

9. The user identification card connecting device according to claim 3, further comprising:
   binding springs which are provided in the slots of the first side-supporting part and the second side-supporting part to bind the user identification card when the user identification card is fully inserted.

10. The user identification card connecting device according to claim 1, wherein a lower surface of the contact part of the heat radiation device includes the protrusion;
    wherein when the user identification card is being inserted the protrusion contacts an outer surface of the user identification car thereby separating other portions of the contact part form the user identification card; and
    wherein when the user identification card is in a fully inserted position, the protrusion couples to a recess in the user identification card thereby fixing the user identification card in the fully inserted position.

11. A broadcast reception apparatus comprising:
    a user identification card which is equipped with a conditional access system for selectively receiving a broadcast signal and a memory unit for storing subscriber's information for user identification; and
    a connecting device to which the user identification card is removably connected;
    wherein the connecting device includes a frame which is provided with an insertion part into which the user identification card is inserted, a heat radiation device which is movably mounted to the frame to contact the user identification card, and an elastic member which biases the heat radiation device toward the user identification card to enable the heat radiation device to be kept in contact with the user identification card;
    the heat radiation device includes a contact part that contacts the user identification card, the contact part of the heat radiation device is formed with a protrusion at a lower surface,
    whereby while the user identification card is being inserted, the contact part is separated from the user identification card, and
    when the user identification card is fully inserted, the user identification card is fixed.

12. The broadcast reception apparatus according to claim 11, wherein the elastic member biases the heat radiation device in a direction perpendicular to an insertion direction of the user identification card.

13. The broadcast reception apparatus according to claim 12, wherein the frame includes a first side-supporting part and a second side-supporting part which are formed with slots for guiding the insertion of the user identification card, and a connecting part which connects ends of the first and second side-supporting parts and is provided with a terminal part to which the user identification card is electrically connected.

14. The broadcast reception apparatus according to claim 13, wherein the heat radiation device includes a supporting plate which is movably mounted to the frame the contact part is formed at a lower surface of the supporting plate and located between the first and second side-supporting parts to contact the user identification card, and a plurality of heat radiation fins which are formed at an upper surface of the supporting plate.

15. The broadcast reception apparatus according to claim 14, wherein the heat radiation device further includes a plurality of coupling pins which penetrate the supporting plate and are fixed to the frame to movably couple the supporting plate to the frame, and
the elastic member includes a plurality of coil springs which are coupled to the coupling pins to bias the supporting plate toward the user identification card.

16. The broadcast reception apparatus according to claim 14, wherein the heat radiation device is provided with an insertion guide surface comprising a slanted surface at an end portion of the heat radiation device to guide the insertion of the user identification card.

17. The broadcast reception apparatus according to claim 15, wherein the coupling pins include a screw part which is tightened into the frame, a supporting part which has a larger diameter than the screw part and penetrates the supporting plate, and a head part which is formed at a top of the supporting part and has a larger diameter than the supporting part to support an end of the coil spring.

18. The broadcast reception apparatus according to claim 13, wherein the frame is formed with a plurality of supporting legs for spacing the first and second side-supporting parts apart from a body to which the frame is fixed.

19. The broadcast reception apparatus according to claim 13, wherein the connecting device further includes binding springs which are provided in the slots of the first side-supporting part and the second side-supporting part to bind the user identification card when the user identification card is fully inserted.

20. The broadcast reception apparatus according to claim 11, wherein a lower surface of the contact part of the heat radiation device includes the protrusion;
wherein when the user identification card is being inserted the protrusion contacts an outer surface of the user identification car thereby separating other portions of the contact part form the user identification card; and
wherein when the user identification card is in a fully inserted position, the protrusion couples to a recess in the user identification card thereby fixing the user identification card in the fully inserted position.

* * * * *